Feb. 13, 1962 E. JUSTI ET AL 3,021,378

METHOD FOR PRODUCING THERMOELECTRIC COMPONENTS ON ZINC-ANTIMONY BASIS

Filed March 16, 1960 2 Sheets-Sheet 1

United States Patent Office 3,021,378
Patented Feb. 13, 1962

3,021,378

METHOD FOR PRODUCING THERMOELECTRIC COMPONENTS ON ZINC-ANTIMONY BASIS

Eduard Justi and Georg Neumann, Braunschweig, Germany, assignors to Siemens-Schuckertwerke Aktiengesellschaft, Berlin-Siemensstadt, Germany, a corporation of Germany Filed Mar. 16, 1960, Ser. No. 15,314
Claims priority, application Germany Mar. 21, 1959
8 Claims. (Cl. 136—5)

Our invention relates to the production of thermoelectric components of zinc-antimony and zinc-cadmium-antimony compounds, and particularly to the production of compounds according to the formula $Zn_xCd_{1-x}Sb$ wherein the value of $x$ is greater than zero but not greater than unity. More in particular, the invention relates to the production of zinc-antimony and zinc-cadmium-antimony materials for thermoelectric cooling or heat-pump purposes and for use in thermoelectric current generators.

Many of the multiple-substance materials available as thermoelectric components are mix-crystals or solid solutions which are based upon one of the various semiconducting binary compounds known for thermoelectric purposes, and in which one elemental constituent of that compound is partially substituted by another element from the same group of the periodic system. Among the mix-crystals of this type is the ternary system $Zn_xCd_{1-x}Sb$. This system has become known (from the German published patent application DAS 1,037,481) as being favorably distinct for thermoelectric purposes because of its relatively small Wiedemann-Franz-Lorenz constant in comparison with the component binary compounds CdSb and ZnSb. This ternary system, in comparison with other known and similar systems such as Bi/Se/Te, has the further advantage that its constituents are available in virtually unlimited quantities and are correspondingly cheap. Nevertheless, thermoelectric components made of zinc antimonide and of its mixed crystals with cadmium antimonide, left much to be desired with respect to practical applicability because of the extreme divergence of the thermoelectrical properties observed in various specimens of the same composition, many of them exhibiting, for example, a smaller thermoelectric power (thermoelectric E.M.F. in volts per ° K.) than sometimes obtained in the laboratory with the same substance under apparently the same conditions of production.

We have discovered that by the method described below, the above-mentioned system $Zn_xCd_{1-x}Sb$ can be greatly improved relative to reproducibility of uniform thermoelectric properties and also relative to the magnitudes of such properties.

According to the invention, we first produce a melt of the system in the known manner, for example by mixing the elemental constituents in stoichiometric proportions and melting the mixture. We then temper the resulting mix-crystal material in the solid state at a temperature at which the conductance-temperature curve of the material exhibits an anomaly i.e., a point of discontinuity. This temperature is hereinafter called "conversion temperature." The tempering may also be performed slightly below or slightly above the conversion temperature, the permissible limits being up to about 10° K. above, and down to about 15° K. below, the conversion point. The tempering period is more than one hour, preferably in the decimal order of 10 hours, and may amount, for example, to approximately 24 hours.

According to another feature of our invention, the compounds of the system $Zn_xCd_{1-x}Sb$, produced and tempered as described above, are made thermoelectrically more effective by adding doping substance, such as one or more of the elements lithium, sodium and potassium, or other beneficial addition substances known to improve the quality factor (figure of merit) of thermoelectric alloys and compounds, such as additions of copper, tin or tellurium.

For further explanation of the invention reference will be made to the drawing in which.

Figure 1:
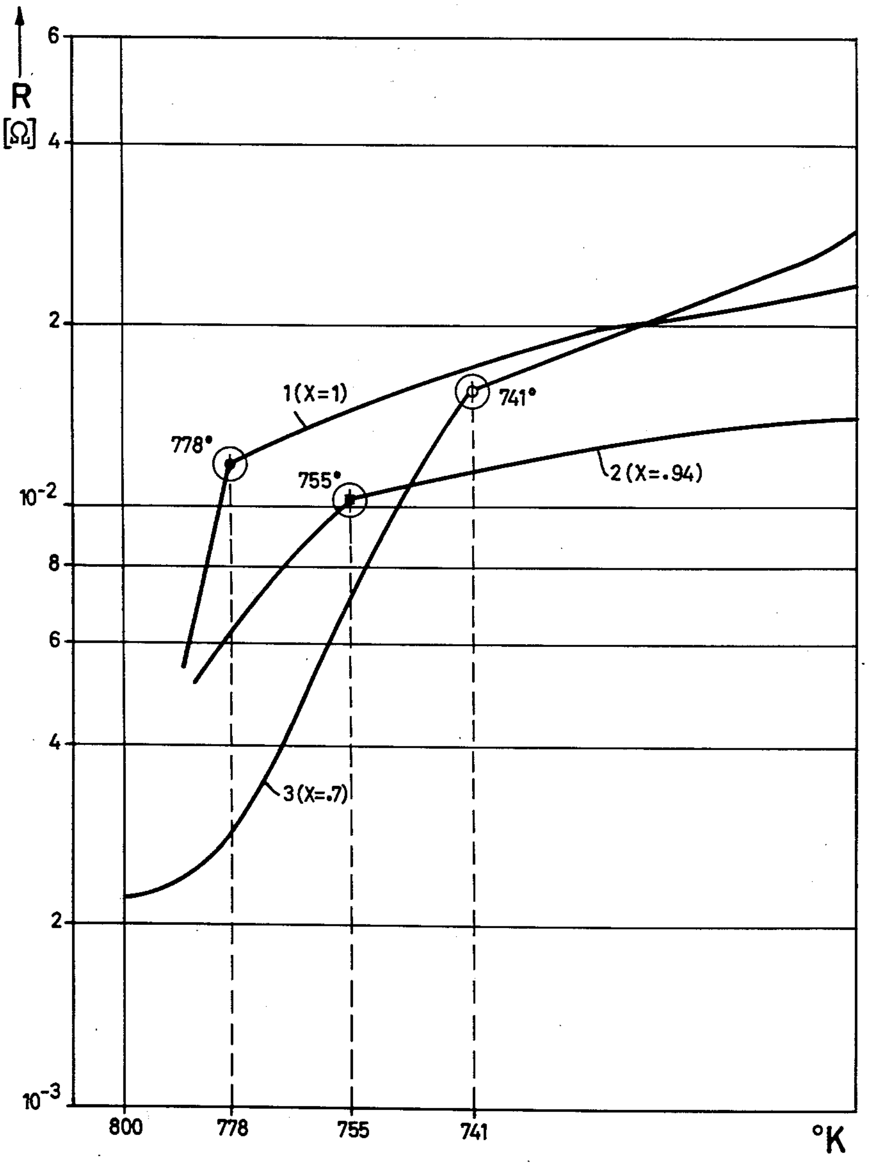
FIG. 1 is a graph representing the resistance-temperature curve for three different compositions of the system $Zn_xCd_{1-x}Sb$.

In the diagram of FIG. 1, the abscissa indicates the absolute temperature in degree Kelvin (° K.). and the ordinate shows the electric resistance R in ohms on a logarithmic scale. The curve 1 corresponds to a composition of the system $Z_{nx}Cd_{1-x}Sb$ in which $x = 1$, and thus indicates the resistance-temperature characteristic of the binary compound ZnSb. The curve 2 in FIG. 1 corresponds to a system composition in which $x = 0.94$, and curve 3 to a composition in which $x = 0.7$. According to the diagram, a conversion temperature, manifested by a discontinuity and identified by a circle, occurs in curve 1 at 778° K. = 505° C., in curve 2 at 755° K. = 482° C., and in curve 3 at 741° K. = 468° C. According to the invention, therefore, these three compositions are to be tempered at 505° C., 482° C., 468° C. respectively or at a temperature slightly below or slightly above these conversion points. Generally, the conversion temperature over the entire system is within the approximate limits of 740° K. and 790° K.

Most probably, the anomalies observed are due to the fact that, normally, the system $Zn_xCd_{1-x}Sb$ is present in different modifications depending upon the temperature, and that a change in modification takes place at the temperature point exhibiting the above-mentioned resistance anomaly. This is the reason why we designate this temperature point as the "conversion temperature."

For further explanation, it may be mentioned that a binary compound of zinc and antimony may occur in different modifications. One of these modifications contains the two elemental constituents in equal atomic proportions in accordance with the stoichiometric formula ZnSb, whereas other modifications contain the two constituents in different atomic proportions. We believe that the improvement obtained by virtue of the tempering process according to our invention is due to the fact that it excludes those compounds that contain their constituents in atomically unequal proportions. In consequence, the thermoelectric properties become satisfactorily reproducible and the occurrence of erratically inferior properties is prevented.

The improvement and reproducibility of the thermoelectric properties of the system $Zn_xCd_{1-x}Sb$ is of considerable magnitude in comparison with the same system produced in accordance with the previously known method according to which, for example, the melt is simply permitted to freeze.

Figure 2:
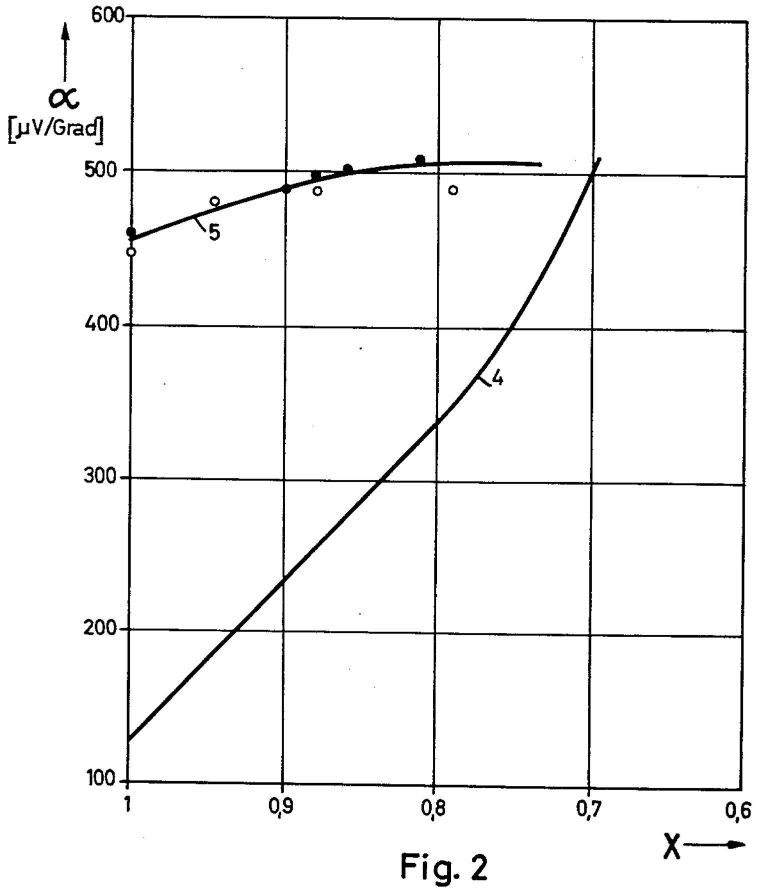
FIG. 2 is a graph showing the differential thermal force ($\alpha$) in dependence upon the composition of the system $Zn_xCd_{1-x}Sb$, with and without application of the tempering process according to the invention.

As far as reliable reproduction of the optimum thermopower and other thermoelectric data is concerned, the improvement afforded by the tempering treatment according to the invention is achieved over the entire range of $Zn_xCd_{1-x}Sb$ compositions, i.e. for any selected value of $x$ appreciably larger than zero and up to the unity value. The increase in thermopower, however, and hence the superiority of the composition processed according to the invention for use in thermoelectric cooling or heat-pump devices, has been found limited to a range of $x$ from about 0.7 to 1. This is apparent from FIG. 2 in which the abscissa is indicative of the $x$-value and hence of the composition of the mix-crystal, and the ordinate indicates the differential thermoelectric power $\alpha$ in $\mu$v./° K. Curve 4 in FIG. 2 relates to the untempered system resulting from freezing a melt, and curve 5 to the system tempered in accordance with the invention. The small circles shown close to curve 5 relate to a tempering treatment slightly above the conversion temperature, whereas the block dots relate to tempering slightly below the same conversion temperature within the above-given limits. It will be recognized that the relative thermopower $\alpha$ of the mix-crystal tempered according to the invention is markedly greater than that of the corresponding untempered specimen for $x$-values from 1 down to about 0.7. For that reason, the invention preferably comprises the above-described tempering treatment applied to $Zn_xCd_{1-x}Sb$ compositions in which $x=0.7$ to 1. Accordingly, the tempering temperatures to be applied to the compositions in the preferred range of $x=0.7$ to 1 are substantially between 741° K. and 778° K. The accurate optimum temperature for each particular batch of material is preferably ascertained by testing a sample specimen, namely by heating the specimen at a temperature gradually increasing through the range of about 700° K. to about 800° K. and simultaneously recording its electric resistance so that the conversion point manifests itself by a discontinuity of the resistance curve as typified in FIG. 1.

The tempering according to the invention may be carried out directly after melting the stoichiometric composition, by permitting the melt to slowly cool down to the tempering temperature which thereafter is maintained for several hours or longer. One way of performing this method is by melting the compound in a furnace and thereafter controlling the cooling and tempering while leaving the melt in the furnace. Another way is to permit the melt to cool down to room temperature and to thereafter again heat the melt to the tempering temperature. The melt is produced from its constituents in the desired stoichiometric composition, for example, 45 atom percent Zn, 5% Cd and 50% Sb ($x=0.9$). The melt may also be produced from a compound body previously prepared and, if desired, purified by zone melting.

Aside from the above-mentioned improvement relative to the magnitude and reproducibility of the thermoforce, the other properties significant for thermoelectric use, such as for cooling purposes, are also favorably modified. This applies particularly to the Wiedemann-Franz-Lorenz constant and to the charge-carrier mobility. This mobility is between approximately 2,500 and approximately 400 cm.²/volt second and thus is considerably higher than the mobility of the comparable other systems mentioned above. Realtive to all properties significant for thermoelectroic use of the Zn-Cd-Sb system, it is generally observed that these properties are accurately reproducible by virtue of the method according to the invention.

The method also affords a particularly favorable application of doping toward improvement of thermoelectric effectiveness. Such doping may be effected with alkali metals, for example with at least one of the elements lithium, sodium or potassium. The doping substances may be added either in form of their compounds, for example as alkali halides, or in metal form. In general, the doping methods known in semiconductor techniques are applicable, such as the method of introducing the doping substance by zone melting. The optimum quantity of the doping substance being used depends upon the particular composition of the system and is determined by comparative sample testing as usual for such purposes. The obtainable effective values are comparable to those of the above-mentioned known systems.

Figure 3:
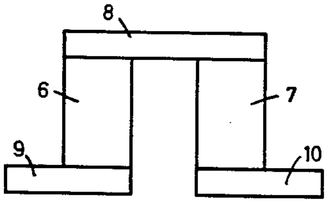
FIG. 3 shows schematically a thermocouple having one or both limbs made of material produced according to the invention.

If desired, the generally p-conductive system $Zn_xCd_{1-x}Sb$ can be converted by doping to n-type conductance, which permits producing thermocouples whose two members consist of a $Zn_xCd_{1-x}Sb$ compound but have different type of conductance. Thus, the limb 6 of the thermocouple shown in FIG. 3 may consist of a p-type Zn-Cd-Sb system made according to the invention, and the limb 7 of an n-type Zn-Cb-Sb system made in the same manner. The two limbs 6, 7 are shown joined by a junction piece 8 of copper which may form or carry a cooling fin if the couple serves cooling purposes. The respective other ends of limbs 6, 7 are joined with terminal pieces 9, 10 of copper. It will be understood that only one of the two limbs need consist of a Zn-Cd-Sb material processed according to the invention and that it may be joined, directly or through a junction piece, with any other suitable thermoelectric component whose thermoelectric power differs from that of the Zn-Cd-Sb limb.

While in the foregoing particular reference was made to thermoelectric elements for cooling or heat-pump purposes, the invention is also advantageously applicable for producing thermocouples to be used for thermoelectric generation of electric current. We have found that, contrary to conventional expectation, the system $Zn_xCd_{1-x}Sb$, if processed according to the invention, exhibits excellent thermoelectric properties also in the range of such higher temperatures as are encountered in the operation of thermoelectric generators. This will be explained presently.

The dependence of the thermopower $\alpha$ upon the absolute temperature T has heretofore been assumed to be in accordance with the Schottky-Pissarenko equation:

$$\alpha=86[A+ln(2(2\pi m^+kT)^{3/2}/h^3n)](\mu\text{v./° K.})$$

In this equation, A denotes a constant depending upon the type of bond of the material and having a value between 0.5 and 4.0, $m^+$ is the effective mass of the charge carriers (electrons or defect electrons), $k$ the Boltzmann constant, T the absolute temperature in ° K., $h$ is Planck's constant, and $n$ the number of charge carriers (electrons or defect electrons) per unit volume (cm.³). According to the equation, the thermopower could increase only proportional to ln $T^{1/2}$ if $n$ increases in at least linear proportion to T as can be assumed in approximation. Hence, the temperature dependence of the thermopower appears to be so slight as to be negligible technologically. At low temperatures the equation indicates an increase of $\alpha$ with T, but at high temperatures $\alpha$ appears to decrease in proportion to $1/T$.

We have discovered that the system $Zn_xCd_{1-x}Sb$, if processed according to the invention, exhibits properties adverse to those expected in accordance with the above-mentioned theory, in that the thermopower $\alpha$ appreciably increases with temperature in the range above normal room temperature (20° C.). For example, the increase in thermopower in Zn-Cd-Sb mix-crystals wherein the amount of cadmium is about 10 to 20 mole percent, is approximately 20% in the temperature range between 300° K. and 600° K.

Another advantage of the mix-crystal composition produced according to the invention is the fact that the lattice thermal conductance ($\kappa_{ls}$) decreases with increasing temperature, for example in the temperature range of 300° K. to 600° K. In general, the lattice thermal conductance is independent of temperature insofar as it is caused by scattering of phonons on phonons. It is further of advantage that the electric conductance ($\sigma$) also increases with increasing temperature. This is another unexpected phenomenon observed with the above-described substances upon treatment according to the invention, because according to prior knowledge the conductivity was supposed to decrease from very low temperatures up to normal room temperature (300° K.).

The above-mentioned properties of the system $Zn_xCd_{1-x}Sb$ produced according to the invention have the resultant effect that the effectivity or quality factor (also called "figure of merit") $z=\alpha^2\sigma/\kappa$, decisive for the efficiency of thermoelectric current generation, considerably increases between room temperature (300° K.) and 600° K.

It is known from the theory of the thermoelectric effect that the so-called "doping rule" must be met for the hot as well as for the cold junction of the current-generating thermoelectric combination (thermocouple) if maximum effectiveness is to be attained. This rule prescribes controlling the thermopower $\alpha$ by doping the material with suitable donor or acceptor substance to the extent required to make $\alpha=172\ (1+\kappa_{el}/\kappa_{ls})$. In this equation, $\kappa_{el}$ denotes the electronic component of the thermoconductance, and $\kappa_{ls}$ the lattice thermal conductance. For that reason it has been proposed to differently dope the individual limbs of a thermocouple at respectively different localities, but this has been too difficult and unreliable for industrial production, particularly since at high temperatures such local differences in doping tend to vanish due to diffusion. It has also been proposed to compose each individual limb of a thermoelectric combination of two different pieces of which each satisfies, on the average, the above-mentioned doping rule for the colder or hotter half-portion of the temperature range. Thus, it has been proposed to use $Bi_2Te_3$ for the lower temperature range while employing for the higher temperature range a compound of the type $A^{III}B^{V}$ having a high melting point in comparison with $Bi_2Te_3$. This, however, involves technological difficulties and can be realized only at great expense, aside from the fact that diffusion at high temperature tends to cause aging.

The use of thermoelectric Zn-Cd-Sb systems produced according to the present invention does not encounter the above-mentioned problem. This is because the thermopower $\alpha$ greatly increases with the temperature T; $\sigma$ and $\kappa_{el}$ also increase with temperature, whereas $\kappa_{ls}$ decreases with $1/T$, as set forth above. Thus, the value $\kappa_{el}/\kappa_{ls}$ adjusts itself in dependence upon temperature in a sense corresponding to the increase of $\alpha$ with increase in T.

As in the case of thermoelectric components for cooling purposes, the method according to the invention applied for the production of thermoelectric current generators, affords the advantage of more accurately reproducible qualities over the entire range of $Zn_xCd_{1-x}Sb$ in which the value of $x$ is sufficiently greater than zero to make the compound thermoelectrically differ from the binary compound CdSb; but best results are obtained with compositions whose ZnSb concentration is at least 70 mole percent (within the range of $x$=0.7 to 1) because then the processed compositions are also superior as regards thermopower magnitudes to those heretofore available for such purposes.

As mentioned above, the compositions to be processed according to the invention may be doped with beneficial addition substances acting as donors or acceptors, with the result of improving the quality factor $z$. When applying such doping prior to tempering the composition, each individual component or limb of a thermocouple is preferably composed of the abovementioned system $Zn_xCd_{1-x}Sb$ with a ZnSb concentration of at least 70 mole percent, and this limb is doped in uniform distribution to the extent required to make the temperature-dependent increase in differential thermopower $\alpha$ approximately proportional to the increase in the ratio of electronic heat conductance $\kappa_{el}$ to lattice thermal conductance $\kappa_{ls}$ in accordance with the optimizing equation $$\alpha=172(1+\kappa_{el}/\kappa_{ls})\pm30\%\ (\mu v./deg.)$$

If desired, the method according to the invention permits doping the system $Zn_xCd_{1-x}Sb$ by donor substance so that the originally p-conductive material is converted to n-type conductance. Suitable for such doping purposes are elements of the sixth group of the periodic system, for example sulfur, selenium and/or tellurium, or compounds of these elements. This makes it possible to use for the positive as well as for the negative limb of a thermocouple a mix-crystal Zn-Cd-Sb composition made according to the invention of which one has p-type conductance whereas the other has n-type conductance.

We have found that for producing thermoelectric p-type components according to our invention of high thermoelectric power $\alpha$ and a maximum quality factor $z$, the addition of copper or tin to the system $Zn_xCd_{1-x}Sb$ is particularly favorable. Copper is applicable in quantities of 0.01 to 0.05% by weight relating to the total weight of the zinc-cadminum-antimony system. Higher quantities of added copper are also applicable but have not been observed to produce further beneficial results. Tin may be added in a quantity from 0.01% to a relatively large amount, for example about 1.0% by weight of the total composition.

For example, an addition of 0.01% by weight of Cu to $Zn_{0.9}Cd_{0.1}Sb$ resulted in a measured thermopower of $\alpha=+186.9\mu v./deg.$ and a quality factor of $z=0.87\cdot10^3$ per degree. Among the most favorable compositions for the purposes of the invention is the just-mentioned mix-crystal $Zn_{0.9}Cd_{0.1}Sb$ with an addition of 0.01 to 0.04, preferably 0.02% by weight of metallic copper. This permits achieving effectivity values of approximately $z=0.89\cdot10^{-3}$ per °K.

As mentioned, the doping may be effected prior to tempering by zone melting, although the various other doping methods generally known for the processing of electronic semiconductors are likewise applicable. However, we have found that satisfactory results are obtained in a simpler manner by preparing a pre-alloy from the particular Zn-Cd-Sb system being used with the doping substance, and then mixing the pre-alloy with a quantity of the same system in order to obtain the desired dilution of the doping substance.

An example of such a doping method, employed in conjunction with the tempering process described above, will be described presently.

0.9 mole of zinc (58.842 grams), 0.1 mole cadmium (11.241 g.) and 1 mole antimony (121.7 g.) were mixed with 0.03% by weight of copper (0.0575 g.). The pulverulent mixture was placed into a quartz ampule which was previously thoroughly cleaned with chrome-sulfuric acid, rinsed several times with distilled water and thereafter dried by heat. The quartz ampule charged with the mixture was evacuated down to a pressure of at most $10^{-5}$ mm. Hg and was thereafter fused off. The ampule thus sealed was placed into an electric furnace and subjected to a temperature of 650° C. In intervals of 15 to 20 minutes the ampule was temporarily taken out of the furnace and was shaken in order to prevent de-mixing otherwise possible because of the different densities of the constituents. The ampule was completely enclosed within the furnace so that none of the sealed constituents could sublimate and condense at the ampule walls. After continuing the processing for three to four hours, the ampule was taken out of the furnace and cooled down to room temperature. Subsequently, the ampule with its content was tempered for 24 hours at 468° C., this being the conversion temperature of the above-specified composition. After cooling the ampule, the tempered substance was removed therefrom, and the above-mentioned data were measured, including the $z$ value of $0.89\cdot10^{-3}$ deg.$^{-1}$. These same values were reproduced by processing other specimens of the same composition in the same manner.

We claim:

1. The method of producing a thermoelectric component from a composition of the system $Zn_xCd_{1-x}Sb$ wherein $x$ is larger than zero but not larger than unity, which comprises melting the composition, freezing the melt and thereafter tempering it in the solid state for more than one hour at a temperature between about 741° K. and 778° K. corresponding substantially to the conversion temperature of the composition as manifested by a discontinuity point of its conductance-temperature characteristic.

2. The method of producing a thermoelectric component from a composition of the system $Zn_xCd_{1-x}Sb$ wherein $x$ is larger than zero but not larger than unity, which comprises melting the composition, freezing the melt and thereafter tempering the composition in the solid state for a period of more than 10 hours at a tempering temperature between about 741° K. and 778° K. corresponding substantially to the conversion temperature of the composition manifested by a discontinuity point of its conductance-temperature characteristic.

3. The method of producing a thermoelectric component from a composition of the system $Zn_xCd_{1-x}Sb$ wherein $x$ is 0.7 to 1, which comprises melting the composition, freezing the melt and thereafter tempering the composition in the crystalline state for a period in the order of 10 hours at a temperature in the range from about 741° K. to about 778° K. and corresponding substantially to the conversion temperature of the composition as manifested by a discontinuity point of its conductance-temperature characteristic.

4. The method of producing a thermoelectric component from a composition of the system $Zn_xCd_{1-x}Sb$ wherein $x$ is 0.7 to 1, which comprises melting the composition, freezing the melt and thereafter tempering it in the solid state for a minimum period of about 10 hours at the conversion temperature of said compound within the range of about 741° K. to about 778° K.

5. The method of producing a thermoelectric component from a composition of the system $Zn_xCd_{1-x}Sb$ wherein $x$ is larger than zero but not larger than unity, which comprises melting the composition and doping it with less than 1% by weight of addition substance from the group consisting of lithium, sodium and potassium, freezing the melt and thereafter tempering the product in the solid state at the conversion temperature of the composition between about 740° K. and 790° K. as manifested by a discontinuity point of its conductance-temperature characteristic.

6. The method of producing a thermoelectric component from a composition of the system $Zn_xCd_{1-x}Sb$ wherein $x$ is 0.7 to 1, which comprises melting the composition and doping it with copper in an amount of 0.01 to 0.04% by weight, freezing the melt and thereafter tempering the product in the solid state at a conversion temperature of the composition between about 741° K. and about 778° K. as manifested by a discontinuity point of its conductance-temperature characteristic.

7. The method of producing a thermoelectric component which comprises melting a composition of zinc, cadmium and antimony substantially in the proportion $Zn_{0.9}Cd_{0.1}Sb$, freezing the melt and thereafter tempering the composition in the solid state at about 468° C. for a minimum period of approximately 10 hours.

8. The method of producing a thermoelectric component which comprises melting a composition of zinc, cadmium and antimony substantially in the proportion $Zn_{0.9}Cd_{0.1}Sb$ with an admixture of copper in an amount of 0.01 to 0.04% by weight, freezing the melt and thereafter tempering the composition in the solid state at about 468° C. for a minimum period of approximately 10 hours.

References Cited in the file of this patent

UNITED STATES PATENTS

| | | |
|---|---|---|
| 2,758,146 | Lindenblad | Aug. 7, 1956 |
| 2,788,382 | Faus et al. | Apr. 9, 1957 |
| 2,793,243 | Lindenblad | May 21, 1957 |
| 2,898,743 | Bradley | Aug. 11, 1959 |
| 2,902,529 | Busanovich | Sept. 1, 1959 |

FOREIGN PATENTS

| | | |
|---|---|---|
| 1,201,745 | France | July 15, 1959 |